United States Patent
Kikuchi et al.

[11] Patent Number: 5,839,877
[45] Date of Patent: Nov. 24, 1998

[54] SUCTION HOLDING ASSEMBLY FOR LEAD FRAMES

[75] Inventors: Eiji Kikuchi, Musashi Murayama; Kouhei Suzuki, Tachikawa; Hideki Okajima, Mitaka, all of Japan

[73] Assignee: Kabushiki Kaisha Shinkawa, Tokyo, Japan

[21] Appl. No.: 677,511

[22] Filed: Jul. 10, 1996

[30] Foreign Application Priority Data

Jul. 13, 1995 [JP] Japan ................................... 7-199311

[51] Int. Cl.⁶ .................................................. B65G 59/04
[52] U.S. Cl. ........................... 414/797; 414/749; 901/40; 294/65.5
[58] Field of Search ........................ 901/40, 16; 414/900, 414/796.9, 797, 749; 294/65.5

[56] References Cited

U.S. PATENT DOCUMENTS

| | | | |
|---|---|---|---|
| 3,860,280 | 1/1975 | Karlsson | 294/65 |
| 4,565,478 | 1/1986 | Ericsson | 414/900 |
| 4,685,714 | 8/1987 | Hoke | 294/65 |
| 4,732,376 | 3/1988 | Umezawa | 414/900 |
| 5,024,575 | 6/1991 | Anderson | 294/65 |
| 5,050,919 | 9/1991 | Yakou | 901/40 |
| 5,609,377 | 3/1997 | Tanaka | 901/40 |
| 5,653,575 | 8/1997 | Park et al. | 414/797 |
| 5,685,589 | 11/1997 | Kikuchi et al. | 294/65 |

FOREIGN PATENT DOCUMENTS 62-175324  8/1987  Japan .

*Primary Examiner*—Karen M. Young
*Assistant Examiner*—Gregory A. Morse
*Attorney, Agent, or Firm*—Koda & Androlia

[57] ABSTRACT

A device for picking up, via suction, a lead frame from a lead frame magazine and placing it on a guide rail so that the lead frame is fed to a bonding machine. This device includes a plurality of lead frame suction nozzles disposed in at least two parallel rows such that one row of the two parallel rows of the lead frame suction nozzles is movable toward and away from an other row of the lead frame suction nozzles. In addition, the lead frame suction nozzles in each of the two rows can be moved closer to and away from each other within each of the rows.

6 Claims, 5 Drawing Sheets

SUCTION HOLDING ASSEMBLY FOR LEAD FRAMES

BACKGROUND OF THE INVENTION

1. Field of the Invention

The present invention relates to a suction holding assembly for lead frames used in lead frame supply/discharge devices.

2. Prior Art

For example, in die bonding performed on lead frames, lead frames which are stacked in a lead frame magazine are taken out one by one by being held by suction via a plurality of suction nozzles of a suction holder and placed on guide rails. Then, the lead frames which have been placed on the guide rails are conveyed to the bonding area of a bonding apparatus by a lead frame feeding means such as a pusher, feeding pawls, etc. while being guided by guide grooves formed in the guide rails.

A lead frame supply/discharge device of this type is disclosed in, for example, Japanese Patent Application Kokai (Laid-Open) No. 62-175324.

In the lead frame suction holding assembly of this prior art, a plurality of lead frame suction nozzles are installed in a single row on the lead frame suction holder so that the central portion of the lead frame in the direction of the length of the lead frame is held by suction attachment. However, since a punched-out space is formed in the central portion of the lead frame, and since leads are formed in this space, it is not desirable to hold the central portion of the lead frame by suction. In addition, in the case of a wide lead frame, holding the lead frame by the central portion alone may cause problems in terms of stability.

Furthermore, in the prior art device described above, respective suction holding assemblies are constructed for each type of product to be handled. Accordingly, in cases where the length or width of the lead frames are changed due to a change in the type of product to be handled, the suction holding assembly must be replaced by another type of device which meets the new type of product to be handled. As a result, a separate suction holding assembly must be provided for each type of product to be handled, and there are problems in terms of device storage control and economy, etc.

SUMMARY OF THE INVENTION

Accordingly, the primary object of the present invention is to provide a suction holding assembly for lead frames which allows stable suction holding of lead frames without causing any scratches to the lead surfaces of the lead frames.

It is another object of the present invention to provide an all-purpose suction holding assembly for lead frames which can handle various types of products.

The objects of the present invention are accomplished by a unique structure for a suction holding assembly which picks up lead frames which are accommodated inside a lead frame magazine by suction and then places them on guide rails, and the unique structure of the present invention is that the suction holding assembly includes a plurality of lead frame suction nozzles which are disposed in two rows on a suction holder which is moved in the vertical direction and in the horizontal Y direction perpendicular to the X direction. In this structure, the X direction is the length-wise direction of the guide rails along which the lead frames are conveyed, and both edge portions of each lead frame with respect to the direction of length of the lead frame are held by suction effected by the suction nozzles.

The present invention provides another unique structure for the suction holding assembly described above, and the unique structure of the present invention is that the plurality of lead frame suction nozzles installed in two rows are provided so that not only are the positions of the suction nozzles in the direction of width of the lead frame adjusted by moving the respective rows of suction nozzles in the direction of width of the lead frame but also the position of the suction nozzles in the direction of length of lead frame is adjusted by moving the suction nozzles in the direction of length of the lead frame.

The present invention provides a further unique structure for the suction holding assembly above described above, and the unique structure is that the central portions of a pair of Y direction shafts which extend in the Y direction are respectively fastened to both sides of a suction holder (with respect to the X direction), a pair of sliding blocks are installed on both ends of each one of the two Y direction shafts so that the sliding blocks can slide on the Y direction shafts and then be positionally fastened to the Y direction shafts, X-direction guide plates which extend in the X direction are fastened to the respective pairs of sliding blocks facing each other in the X direction, and the plurality of lead frame suction nozzles are installed on the X-direction guide plates so that the suction nozzles can slide on these guide plates and then be positionally fastened to these guide plates.

DETAILED DESCRIPTION OF THE PREFERRED EMBODIMENTS

Below, an optimal working configuration of the present invention will be described with reference to FIGS. 1 through 7.

Figure 1:
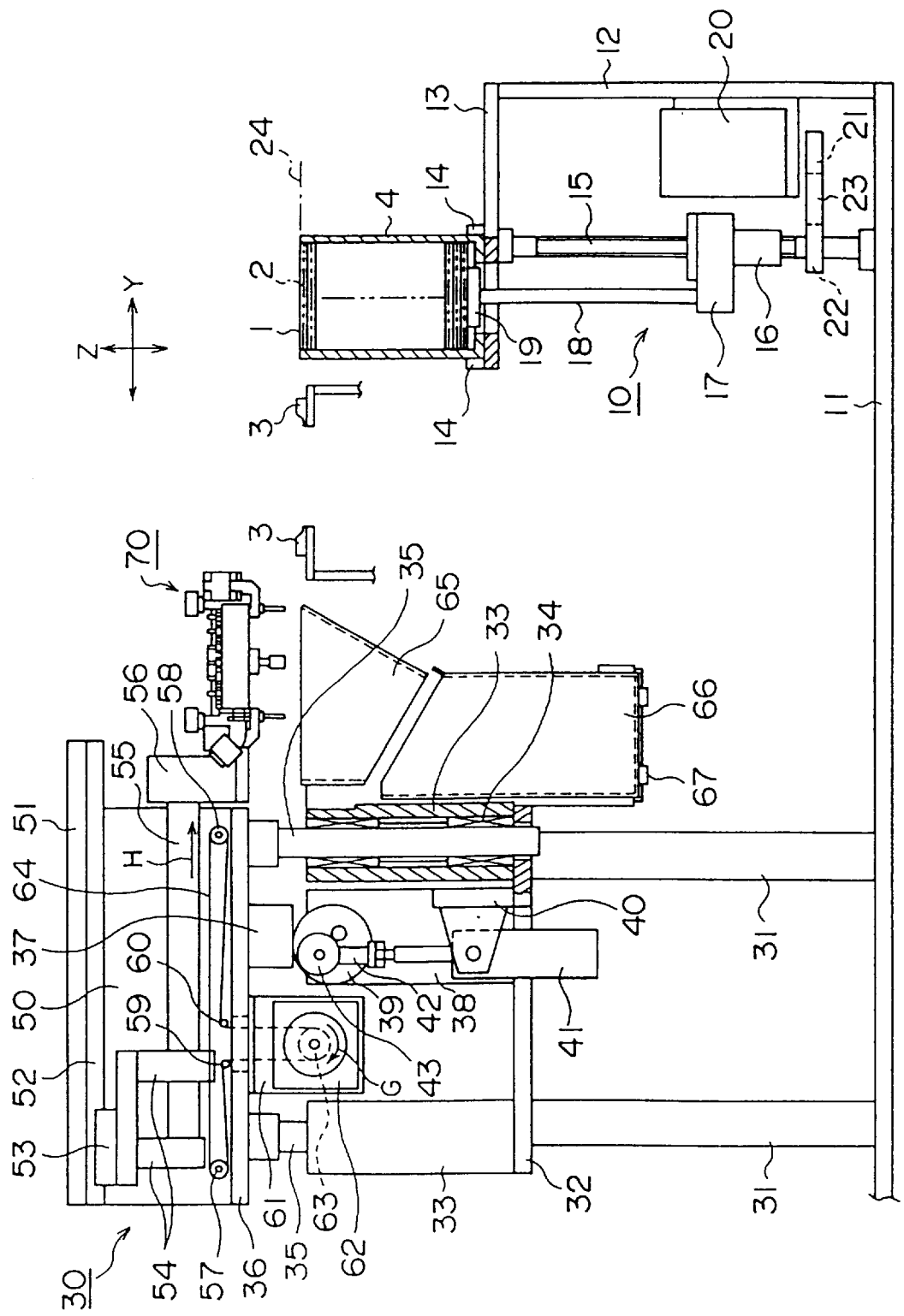
FIG. 1 is a partially sectional side view which illustrates one working configuration of a lead frame supply/discharge device which includes a suction holding assembly for holding lead frames according to the present invention.

In FIG. 1, the reference numeral 10 refers to an elevator device which is used with lead frame suction holding assembly 70 with a pair of guide rails 3 and 3 in between. The suction holding assembly 70 is provided on the suction holding assembly driving device 30.

The elevator device 10 positions and holds a lead frame magazine 4 which is positioned on the front side (right side in FIG. 1) of the pair of guide rails 3 which guide the lead frames 1. The lead frame magazine 4 accommodates the lead frames 1 and papers 2. The lead frames 1 and papers 2 are stacked in an alternating configuration in the lead frame magazine 4, so that damage to the circuit surfaces that would be caused by contact between adjacent lead frames 1 is prevented.

In the elevator device 10, positioning plates 14 which position the lead frame magazine 4 are installed on the magazine carrying plate 13 of an elevator device frame that is comprised of a base plate 11, a side plate 12 and the magazine carrying plate 13. The upper and lower ends of a screw shaft 15 are supported between the base plate 11 and the magazine carrying plate 13 so that the screw shaft 15 is rotatable. Furthermore, the upper and lower ends of two rotation-preventing shafts (not shown) are fastened to the base plate 11 and magazine carrying plate 13. An up-and-down block 16 having an inner thread therein is engaged with the screw shaft 15, and a raising-and-lowering shaft holder 17 which is fitted over the rotation-preventing shafts so that the raising-and-lowering shaft holder 17 can move upward and downward is fastened to this up-and-down block 16. A raising-and-lowering shaft 18 which extends upward through the magazine carrying plate 13 and the bottom plate 5 of the magazine 4 is fastened to the raising-and-lowering shaft holder 17, and a push-up plate 19 is fastened to the upper end of the raising-and-lowering shaft 18.

A motor 20 is mounted to the side plate 12, and a first timing pulley 21 is coupled to the output shaft of the motor 20. A second timing pulley 22 is fastened to the screw shaft 15 so as to face the first timing pulley 21, and a timing belt 23 is installed between the timing pulley 21 and timing pulley 22. The reference numeral 24 denotes the nozzle suction position for suction-holding the lead frames 1.

In the following description, the direction along the length of the guide rails 3 will be referred to as the "X direction", the horizontal direction perpendicular to the X direction will be referred to as the "Y direction", and the vertical direction will be referred to as the "Z direction".

On the back side (left side in FIG. 1) of the guide rails 3, the suction holding assembly driving device 30 is provided which causes the suction holding assembly 70 to move in the Z and Y directions.

In this suction holding assembly driving device 30, two bearing holders 33 are fastened to a fastening plate 32 which is provided on the upper ends of four supporting legs 31, and raising-and-lowering shafts 35 are provided in the bearing holders 33 with bearings 34 (only one shown) in between so that the shaft 35 is moved up and down. A raising-and-lowering plate 36 is fastened to the raising-and-lowering shafts 35, and an actuating plate 37 is fastened to the undersurface of this raising-and-lowering plate 36.

A cam supporting plate 38 is fastened to the fastening plate 32, and a cam 39 is rotatably provided on the cam supporting plate 38 so that the actuating plate 37 presses against the cam 39. A cylinder supporting plate 40 is fastened to the side surface of one of the bearing holders 33, and an air cylinder 41 is supported on the cylinder supporting plate 40 so that the air cylinder 41 is tiltable. A pin 43 is rotatably provided on a connecting shaft 42 which is fastened to the operating rod of the air cylinder 41, and this pin 43 is fastened to the cam 39.

A side plate 50 is provided on the raising-and-lowering plate 36, and a rail supporting plate 51 is fastened to the side plate 50. A rail 52 which extends in the Y direction is fastened to the undersurface of the rail supporting plate 51, and a guide plate 53 is attached to the rail 52 so that the guide plate 53 slides along the rail 52.

A Y-direction moving shaft holder 54 is fastened to the guide plate 53, and one end of a Y-direction moving shaft 55 which extends in the Y direction is fastened to the Y-direction moving shaft holder 54. A suction holding assembly holder 56 is fastened to the other end of the Y-direction moving shaft 55 so that the holder 56 is located near the guide rails 3, and the suction holding assembly 70 is mounted on this suction holding assembly holder 56.

On the side plate 50, a pair of timing pulleys 57 and 58 are rotatably provided so that they are located beneath the left and right ends of the Y-direction moving shaft 55. In addition, two guide rollers 59 and 60 are rotatably provided on the side plate 50 so that the rollers 59 and 60 are positioned between the timing pulleys 57 and 58 and slightly lower than the timing pulleys 57 and 58.

A motor supporting plate 61 is fastened to the undersurface of the raising-and-lowering plate 36 so as to be located beneath the guide rollers 59 and 60, and a motor 62 is mounted to this motor supporting plate 61. A timing pulley 63 is coupled to the output shaft of the motor 62, and a timing belt 64 is provided on the timing pulleys 57 and 58, the guide rollers 59 and 60 and the timing pulley 63. A part of the upper portion of the timing belt 64 which is between the timing pulleys 57 and 58 is fastened to the Y-direction moving shaft holder 54.

A paper receiving chute 65 is fastened to the upper portion of the bearing holder 33 that is located on the guide rails 3 side, and a paper disposal box holder 67 which holds a paper disposal box 66 is fastened beneath the paper receiving chute 65.

The structure of the suction holding assembly 70, which include a suction holder 72, will be described below with reference to FIGS. 2 through 7.

Figure 2:
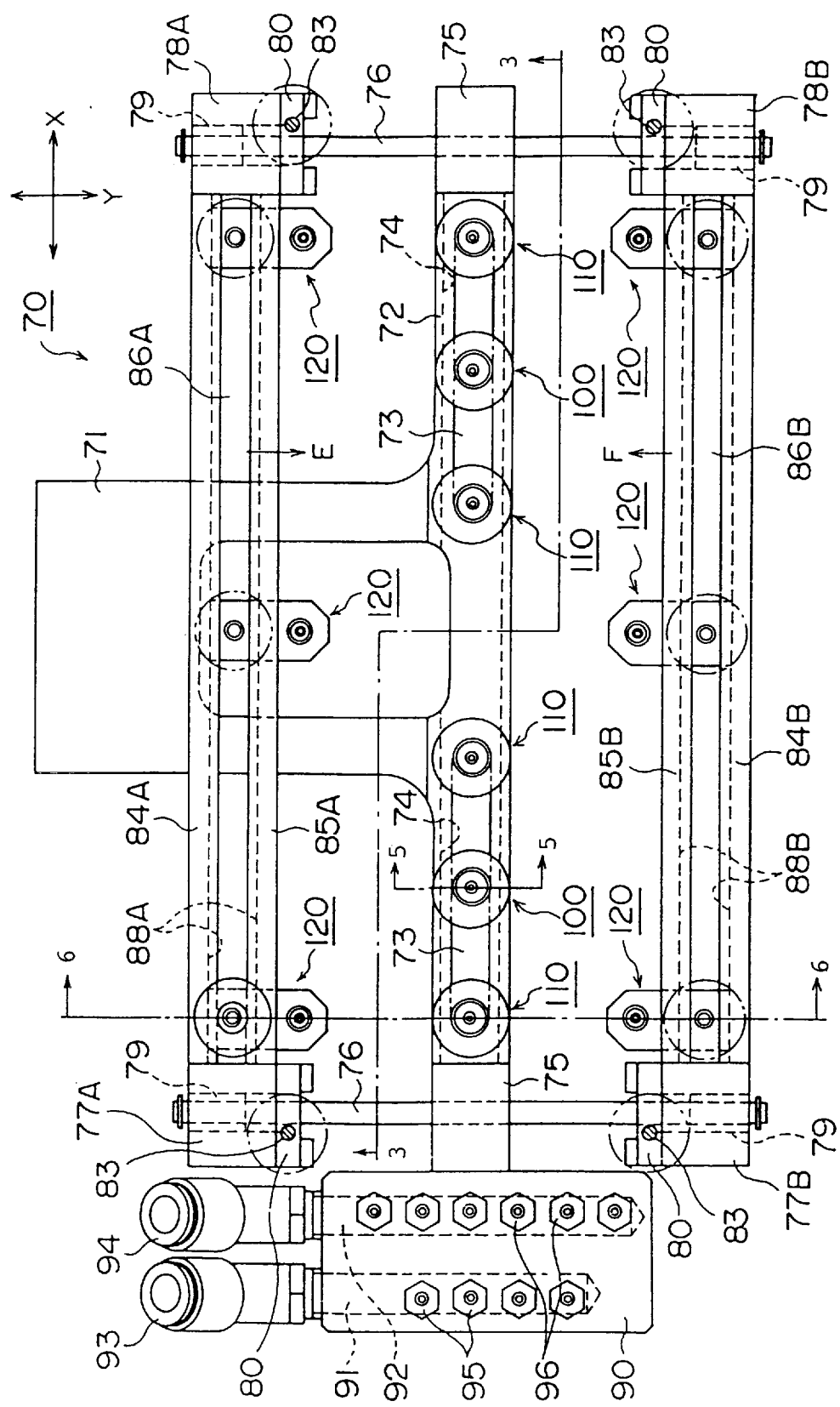
FIG. 2 is a top view of the suction holding assembly shown in FIG. 1.
Figure 4:
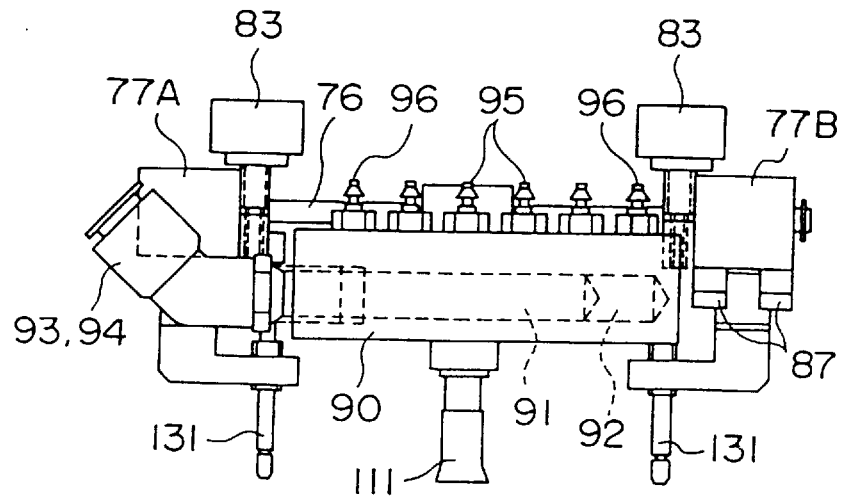
FIG. 4 is a side view of FIG. 2.

As shown in FIGS. 2 and 4, the suction holder 72 is formed with a mounting plate 71 which is secured to the suction holding assembly holder 56 (see FIG. 1); and, as best seen in FIG. 2, two slots 73 which extend in the X direction are formed in this suction holder 72. In addition, rotation-preventing grooves 74 which are wider than the slots 73 are formed, along the slots 73, on the undersurface of the suction holder 72.

Y-direction shaft supporting holders 75 are fastened to both ends (in the X direction) of the suction holder 72, and each one of a pair of Y-direction shafts 76 is fastened, at its center, to each one of these two Y-direction shaft supporting holders 75.

Sliding blocks 77A, 77B, 78A and 78B are slidably fitted over both ends of each of two Y-direction shafts 76 with bearings 79 in between. In addition, fastening holders 80 are fitted over the Y-direction shafts 76 so that the holders 80 are located on the inner sides of the sliding blocks 77A, 77B, 78A and 78B. In addition, as best seen from FIG. 3, each of the fastening holders 80 is split into two parts by a slit 81 so that the Y-direction shaft is located in the slit 81.

The portions of the fastening holders 80 located below the slits 81 are fastened to the respective sliding blocks 77A, 77B and 78A, 78B by screws 82. In addition, sliding block fastening screws 83 are engaged with the portions of the sliding blocks 77A, 77B and 78A, 78B, the portions being located below the slits 81, so that the portions of the fastening holders 80 above the slits 81 are pressed against the sliding blocks 77A, 77B and 78A, 78B from above.

Pairs of X-direction guide plates 84A and 85A and 84B and 85B which extend in the X direction are fastened at both ends thereof to the undersurface of the sliding blocks 77A and 78A and of the sliding blocks 77B and 78B, respectively, by means of screws 87 (see FIG. 4) so that guide gaps 86A and 86B are formed between the plates 84A and 85A and between the plates 84B and 85B. Rotation preventing grooves 88A and 88B are formed on the inner edges of the undersurface of the guide plates 84A and 85A and of the guide plates 84B and 85B.

As seen from FIG. 2, a vacuum connection block 90 is fastened to one end (left end in FIG. 2) of the suction holder 72. The vacuum connecting block 90 is provided with first and second vacuum passages 91 and 92, which are blind holes. Each one of the vacuum connecters 93 and 94 is attached to the first and second vacuum passages 91 and 92 respectively. These vacuum connecters 93 and 94 are connected to a vacuum pump via pipes and electromagnetic valves (which are not shown).

Four vacuum connection pieces 95 are attached to the surface of the vacuum connection block 90 so that the vacuum connection pieces 95 communicate with the first vacuum passage 91. Six vacuum connection pieces 96 are attached to the surface of the vacuum connection block 90 so that the vacuum connection pieces 96 communicate with the second vacuum passage 92.

One lead frame detection terminal 100 and two paper suction nozzles 110 are provided on the suction holder 72 along each one of the slots 73 so that the lead frame detection terminals 100 and paper suction nozzles 110 can slide along the slots 73. In other words, a total of two lead frame detection terminals 100 and four paper suction nozzles 110 are provided on the suction holder 72. Furthermore, three lead frame suction nozzles 120 are provided to each pair of the guide plates 84A and 85A and the guide plates 84B and 85B so that the lead frame suction nozzles 120 can slide and be positionally fixed inside the guide gaps 86A and 86B.

The details of the lead frame detection terminals 100, paper suction nozzles 110 and lead frame suction nozzles 120 are described below.

Figure 5:
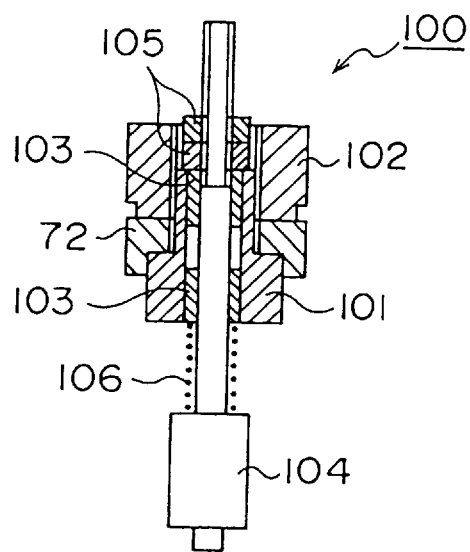
FIG. 5 is a sectional view taken along the line 5—5 in FIG. 2.

FIG. 5 shows the details of one of two lead frame detection terminals 100.

An insulating body 101 is inserted into the corresponding slot 73 of the suction holder 72 so that the insulating body 101 is in contact with the rotation-preventing groove 74, and a nut 102 is screwed onto a screw part formed on the upper portion of the insulating body 101. A detection element 104 made of metal is provided in the insulating body 101 with a bush 103 interposed in between so that the detection element 104 is slidable inside the insulating body 101. Furthermore, the detection element 104 is provided with a spring 106 so that a nut 105 is pressed by the spring 106 against the upper surface of the insulating body 101. Electrical lines (not shown) are connected to the upper ends of the detection element 104 of each one of two lead frame detection terminals 100, and these cords are connected to a detector (not shown).

Figure 6:
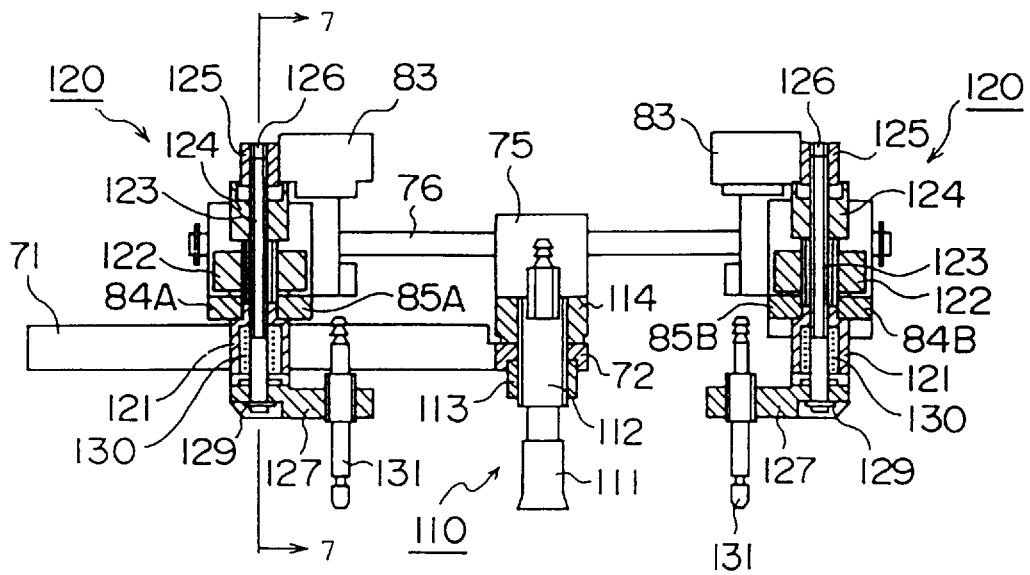
FIG. 6 is a sectional view taken along the line 6—6 in FIG. 2.

FIG. 6 shows the details of the paper suction nozzles 110.

In particular, for each one of four (4) paper suction nozzles 110, a screw pipe 112 which has a vacuum suction pad 111 is inserted into the corresponding slot 73 of the suction holder 72, and a nut 113 is screwed onto the screw part of the screw pipe 112 so that the nut 113 in inserted into the rotation-preventing groove 74 formed in the undersurface of the suction holder 72. In addition, a nut 114 is screwed onto the screw pipe 112 from the upper surface of the suction holder 72. Thus, the screw pipe 112 is fastened to the suction holder 72 by the nut 113 and nut 114. Total of four screw pipes 112 of these four paper suction nozzles 110 are respectively connected to the four vacuum connection pieces 95 shown in FIG. 2 by pipes (not shown).

Figure 7:
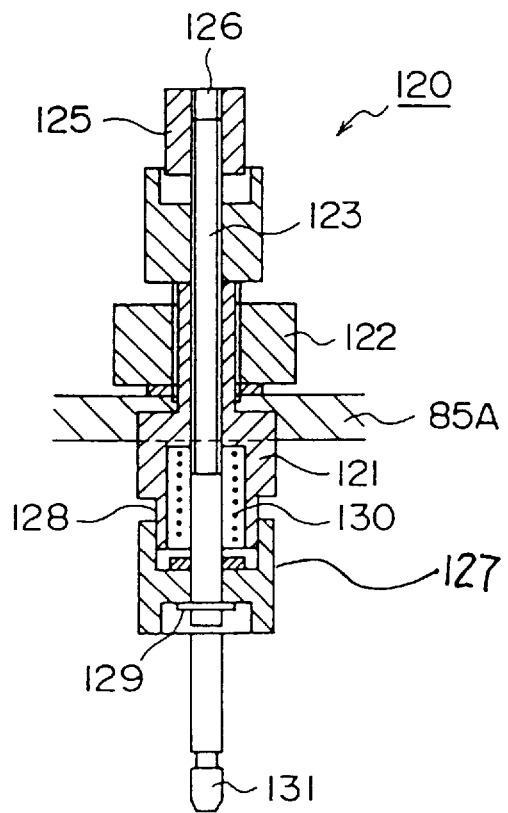
FIG. 7 is a sectional view taken along the line 7—7 in FIG. 6.

FIGS. 6 and 7 show the details of the lead frame suction nozzles 120.

In each of the lead frame suction nozzle 120, the screw portion of a holder 121 is passed through one of two guide gaps 86A and 86B which are formed by the X-direction guide plates 84A and 85A and by the X-direction guide plates 84B and 85B, respectively, so that the screw portion of the holder 121 protrudes upward. A nut 122 is screwed onto the screw portion of the holder 121 so as to positionally fasten the holder 121 to the corresponding guide plates 84A and 85A and the guide plates 84B and 85B. A screw shaft 123 is screwed into the holder 121, and nuts 124 and 125 are screwed onto the screw shaft 123. In addition, a bolt 126 is screwed into the nut 125.

An L-shaped nozzle holder 127 is fitted to the lower end of the screw shaft 123 so that the nozzle holder 127 can be slid up and down. So as to prevent rotation of the nozzle holder 127, the nozzle holder 127 is, as best seen from FIG. 7, inserted into a cut-out side surface 128 formed in the lower portion of the holder 121 in such a manner that the nozzle holder 127 is slidable up and down. Furthermore, a spring 130 is mounted between the holder 121 and the nozzle holder 127 so that the nozzle holder 127 is pressed against a stopper 129 on the lower end of the screw shaft 123. A suction nozzle element 131 is fastened to the tip end of the nozzle holder 127. Total of six (6) suction nozzle elements 131 of six lead frame suction nozzles 120 are respectively connected to the six vacuum connection pieces 95 shown in FIG. 2.

With the structure of the lead frame suction nozzles 120 as described above, if the bolt 126 is sufficiently tightened, the nut 125 is fastened to the screw shaft 123. Then, the nut 124 is loosened and the nut 125 is turned, so that the screw shaft 123 is moved up and down relative to the holder 121. In other words, since the nozzle holder 127 to which the suction nozzle element 131 is attached is supported by the stopper 129 which is installed on the screw shaft 123, the suction nozzle element 131 also moves up and down when the nut 125 is turned. In this way, the position of the lower end of the suction nozzle element 131 can be adjusted. Since six lead frame suction nozzles 120 are provided in the suction holding assembly, the positions of the lower ends of the suction nozzle element 131 of all six lead frame suction nozzles 120 are adjusted to the same horizontal plane by means of the operation described above.

After the position of the lower end of each suction nozzle element 131 has been adjusted, the nut 122 is tightened so that the nut 122 presses against the upper surface of the holder 121, thus fixing the position of the screw shaft 123.

Figure 3:
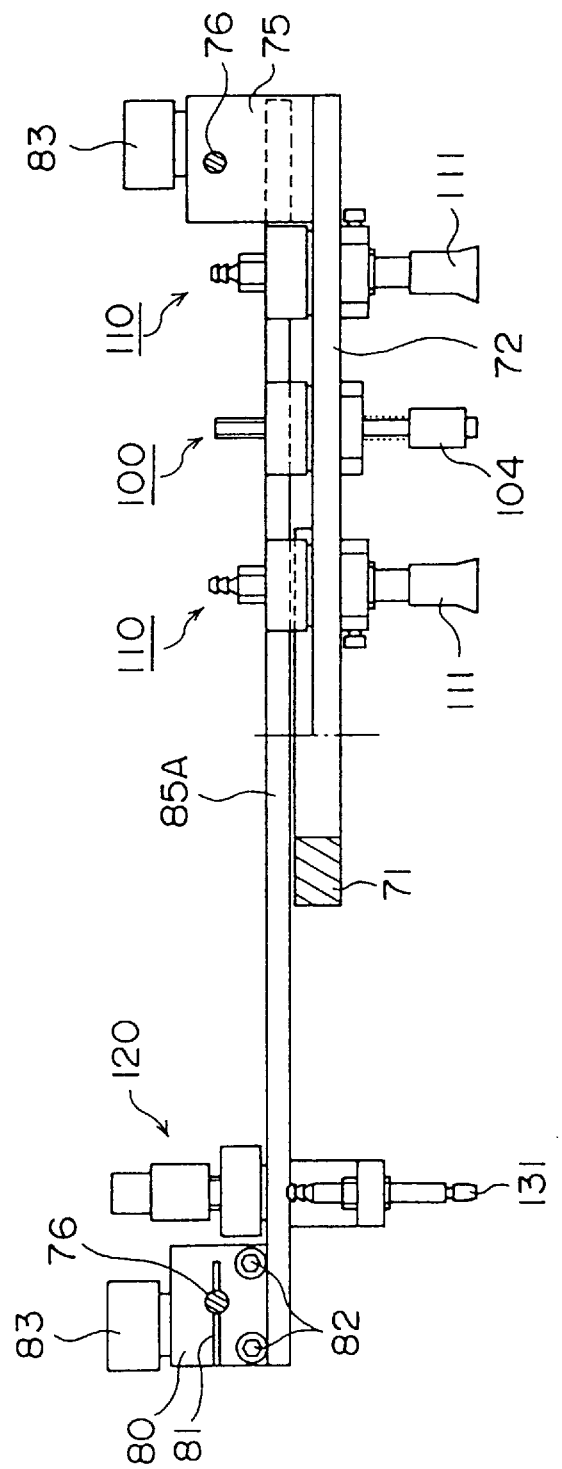
FIG. 3 is a sectional view taken along the line 3—3 in FIG. 2.

Next, the method for adjusting the suction holding assembly 70 will be described. FIGS. 2 and 3 show the case in which the largest size lead frame is handled. Upon changes in the width and length of the lead frames 1 due to a change in the type of product to be handled, the positions of the lead frame detection terminals 100, paper suction nozzles 110 and lead frame suction nozzles 120 are adjusted to as to meet the sizes of the new product (lead frame).

Adjustment in the width-wise direction of the lead frame is described as follows:

Four sliding block fastening screws 83 are loosened so as to bring each pair of sliding blocks 77A and 77B and 78A and 78B to be movable along the Y-direction shafts 76 towards each other.

The X-direction guide plates 84A and 85A attached to the sliding blocks 77A and 78A are moved in the direction indicated by arrow E, and the X-direction guide plates 84B and 85B attached to the sliding blocks 77B and 78B are moved in the direction indicated by arrow F, so that the suction nozzle elements 131 of the lead frame suction nozzles 120 are positioned at the edge portions of the (new) lead frame 1, which is to be handled, in the direction of width, i.e., in the Y direction.

The sliding block fastening screws 83 are tightened back, thus narrowing the slits 81 of the fastening holders 80 so that the fastening holders 80 are fastened to the Y-direction shafts 76.

Adjustment of the paper suction nozzles 110, the detection terminals 100, and the lead frame suction nozzles 120 in the length-wise direction of the lead frame (i.e., the dimension of the lead frames 1 in the X direction) is describe as follows:

For each of the paper suction nozzles 110, as seen from FIG. 6, the nut 114 is loosened so that the screw pipe 112 can be caused to slide along the slot 73. After this, the paper suction nozzle 110 is moved along the slots 73, placed in position which meet the lead frame 1, and then the nut 114 is tightened back.

For each of the detection terminals 100, as seen from FIG. 5, the nut 102 is loosened, thus making it possible to slide the insulating body 101 along the slot 73. Then, the lead frame detection terminal 110 is moved so that each of the detection terminals 100 is positioned more or less midway between the two paper suction nozzles 110 on either side, and the nut 102 is tightened back.

For each of the lead frame suction nozzles 120, as seen from FIG. 6, the nut 122 is loosened, thus making it possible for the holder 121 to slide along one of the slots 86A and 86B. The lead frame suction nozzle 120 is moved in the guide gap 86A or 86B and placed in positions which fit the lead frame 1. Afterward, the nut 122 is tightened back.

Next, the operation which removes lead frames 1 from the magazine 4 and places them on the guide rails 3 will be described with reference to FIG. 1.

With the state illustrated in FIG. 1, the motor 62 of the suction holding assembly driving device 30 is actuated in the direction indicated by arrow G; as a result, the timing belt 64 is rotated in the direction indicated by arrow H. As a result, the Y-direction moving shaft holders 54 and the guide plate 53 are moved in the direction of arrow H while being guided by the guide rail 52. In other words, the Y-direction moving shaft 55 and the suction holding assembly holder 56 mounted thereto are moved in the direction of arrow H so that the suction holding assembly 70 is positioned above the magazine 4.

The air cylinder 41 is next actuated so that the operating rod of the air cylinder 41 is retracted, thus causing the cam 39 to rotate. As a result, the raising-and-lowering plate 36 and the suction holding assembly 70 mounted thereon are lowered via the actuating plate 37, so that the respective tip portions of the detection elements 104 of the lead frame detection terminals 110, the vacuum suction pads 111 of the paper suction nozzles 110 and the suction nozzle elements 131 of the lead frame suction nozzles 120 are all positioned slightly below the nozzle suction position 24, thus causing those tip portions to contact the uppermost lead frame 1 or paper in the magazine 4.

When the lead frame 1 is present in the uppermost position inside the magazine 4, and the detection elements 104 of the two lead frame detection terminals 100 contact the lead frame 1, the detection elements 104 are brought into electrical continuity. Accordingly, a detector (not shown) outputs a signal indicating that the object that is to be held by suction is the lead frame 1. As a result, vacuum suction is applied to the vacuum connecting element 94, and this vacuum suction is transmitted to the suction nozzle elements 131 of the six lead frame suction nozzles 120 via the second vacuum passage 92, pipes (not shown) and vacuum connection pieces 96, so that the lead frame 1 is held by the suction nozzle elements 131.

Then, the operating rod of the air cylinder 41 is caused to move outward (i.e., in the opposite direction from that described above) so that the cam 39 rotates reversely, thus causing the actuating plate 37 and raising-and-lowering plate 36 to moved upward. As a result, the suction holding assembly 70 is raised while holding the lead frame 1 by suction.

When the suction holding assembly 70 is raised while holding the lead frame 1 by suction, the motor 20 is driven so that the next uppermost lead frame 1 is positioned in the nozzle suction position 24.

The motor 62 is caused to rotate in the opposite direction from that described above, so that the timing belt 64 is also moved in the opposite direction from that described above. Since the presence of a lead frame 1 has been detected as described above, the motor 62 is driven until the suction holding assembly 70 is moved above the guide rails 3.

Next, the operating rod of the air cylinder 41 is retracted so that the actuating plate 37 and raising-and-lowering plate 36 are lowered, thus causing the lead frame 1 held by the suction holding assembly 70 to contact the guide rails 3. Then, the vacuum of the vacuum connecting element 94, i.e., the vacuum of the suction nozzle elements 131 of the lead frame suction nozzles 120 is shut off.

The operating rod of the air cylinder 41 is caused to protrude and the motor 62 is rotated in the forward direction, so that the suction holding assembly 70 leaves the lead frame 1 on the guide rails 3 and moves to a position above the magazine 4.

In cases where paper 2 is present in the uppermost position inside the lead frame magazine 4, the following paper detection process occurs:

The detection elements 104 of the two lead frame detection terminals 100 comes into contact with the paper 2 when the suction holding assembly 70 is lowered. Accordingly, no electrical continuity is established, and the detector (not shown) outputs a signal indicating that the item that is to be gripped by suction is not a lead frame but a paper 2. As a result, vacuum suction is applied to the vacuum connecter 93, and this vacuum suction is transmitted to the vacuum suction pads 111 of the paper suction nozzles 110 via the first vacuum passage 91, pipes (not shown) and vacuum connection pieces 95, so that the paper 2 is sucked by the vacuum suction pads 111.

Next, the air cylinder 41 is actuated so that the suction holding assembly 70 is raised; then, the motor 62 is driven so that the suction holding assembly 70 moves to a position above the paper receiving chute 65.

After this, the vacuum of the vacuum connecter 93 is shut off, i.e., the vacuum of the vacuum suction pads 111 of the paper suction nozzles 110 is shut off, so that the paper 2 held up to this point by the vacuum suction pads 111 falls into the paper receiving chute 65 and further into the paper disposal box 66.

The motor 62 is driven so that the suction holding assembly 70 is moved to a position above the magazine 4. Then, the air cylinder 41 is actuated so that the suction holding assembly 70 is lowered.

As a result of the series of operations described above, the lead frames 1 are moved onto the guide rails 3, and papers 2 are accomodated in the paper disposal box 66.

As seen from the above, a plurality of lead frame suction nozzles 120 are disposed in two rows on a suction holder 72 (which is moved in the vertical direction and in the horizontal Y direction which is perpendicular to the X direction which is a lead frame conveying direction on the guide rails 3) so that both edges of each lead frame (with respect to the direction of width of the lead frame) are held by suction; accordingly, no scratching of the lead surfaces of the lead frames 1 would occur, and the lead frames 1 can be stably held by suction.

Furthermore, the plurality of lead frame suction nozzles 120 installed in two rows are provided so that the positions of these nozzles 120 in the direction of width of the lead frame can be adjusted by moving the respective rows of lead frame suction nozzles in the direction of width of the lead frame; and in addition, the plurality of lead frame suction nozzles 120 in each row are provided so that the positions of the lead frame suction nozzles in the direction of the length of the lead frame can be adjusted by moving the lead frame suction nozzles in the direction of length of the lead frame. Accordingly, various types of lead frames can be handled, and therefore, the device has all-purpose utility.

In the above embodiment, the lead frames 1 are accommodated in the magazine 4 with papers 2 in between. However, the invention is applicable to a system in which only stacked lead frames are accommodated in the magazine and no papers are between the lead frames. In this, it goes without saying that the lead frame detection terminals 100 and paper suction nozzles 110 are unnecessary.

As seen from the above, according to the present invention a plurality of lead frame suction nozzles are provided in two rows on a suction holding body which is moved in the vertical direction and in the horizontal Y direction which is perpendicular to the horizontal X-direction (this X-direction being the conveying direction of the guide rails) so that both edge portions of each lead frame are held by suction from the lead frame suction nozzles. In addition, since the plurality of lead frame suction nozzles provided in two rows are provided so that the positions of the lead frame suction nozzles in the direction of width and length of the lead frame can be adjusted by moving the respective rows of lead frame suction nozzles in the direction of width of the lead frame and in the direction of length of the lead frame, various types of lead frames can be handled.

We claim:

1. A suction holding assembly for lead frames which holds lead frames accommodated in a lead frame magazine by suction and places said lead frames on guide rails and said lead frames have a length and a width and edge portions, comprising a suction holder, a plurality of lead frame suction nozzles disposed in at least two parallel rows on said suction holder, and means for moving said suction holder in a vertical direction and in a horizontal Y direction which is perpendicular to an X direction that is a conveying direction of said guide rails so that said edge portions of each lead frame with respect to a direction of one of said length and width of said lead frame are held by suction.

2. A suction holding assembly according to claim 1, wherein said plurality of lead frame suction nozzles installed in at least two parallel rows are installed so that positions of said lead frame suction nozzles in a direction of width of said lead frame can be adjusted by moving of respective rows of lead frame suction nozzles in said direction of said width of said lead frame, and said plurality of lead frame suction nozzles in each row are installed so that positions of said lead frame suction nozzles in a direction of length of said lead frame can be adjusted by moving said lead frame suction nozzles in said direction of length of said lead frame.

3. A suction holding assembly comprising:

Y-direction shafts which extend in a horizontal Y direction are respectively fastened to both ends of a suction holder in an X-direction which is perpendicular to said Y-direction;

sliding blocks are installed on both ends of each of said Y-direction shafts so that said sliding blocks can slide on said Y-direction shafts and positionally fastened to said Y-direction shafts;

X-direction guide plates which extend in the X direction fastened at both ends thereof to each of said sliding blocks which face each other in said X direction; and a plurality of lead frame suction nozzles slidably installed on said X-direction guide plates so that said lead frame suction nozzles are positionally fixed to said X-direction guide plates such that said plurality of lead frame suction nozzles are mounted in at least two parallel rows.

4. A lead frame suction holding assembly which removes lead frames from a lead frame magazine and places said lead frames on guide rails by suction, each of said lead frames having side portions, said assembly comprising a suction holder, a plurality of lead frame suction nozzles disposed in at least two parallel rows on said suction holder so that said side portions of said lead frame are held by suction created by said lead frame suction nozzles, and wherein said suction holder is movable in a vertical direction and in one horizontal direction which is perpendicular to a conveying direction of said guide rails.

5. A lead frame suction holding assembly according to claim 4, wherein said plurality of lead frame suction nozzles disposed in two rows are mounted so that one of said two rows of said lead frame suction nozzles is movable toward and away from an other of said two rows of said lead frame suction nozzles and so that said lead frame suction nozzles of each one of said two rows can be moved closer to and away from the other.

6. A lead frame suction holding assembly according to claim 5, further comprising a lead frame detection terminal and a paper holding nozzle which are provided between said two rows of said lead frame suction nozzles.

* * * * *